(12) United States Patent
Wabra et al.

(10) Patent No.: US 9,588,445 B2
(45) Date of Patent: *Mar. 7, 2017

(54) PROJECTION OBJECTIVE FOR A MICROLITHOGRAPHIC PROJECTION EXPOSURE APPARATUS

(71) Applicant: Carl Zeiss SMT GmbH, Oberkochen (DE)

(72) Inventors: Norbert Wabra, Werneck (DE); Robert Eder, Karlsruhe (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/008,519

(22) Filed: Jan. 28, 2016

(65) Prior Publication Data

US 2016/0282729 A1    Sep. 29, 2016

Related U.S. Application Data

(63) Continuation of application No. 14/506,992, filed on Oct. 6, 2014, now Pat. No. 9,280,058, which is a (Continued)

(51) Int. Cl.
  G03B 27/32    (2006.01)
  G03B 27/42    (2006.01)
  (Continued)

(52) U.S. Cl.
  CPC ..... *G03F 7/70975* (2013.01); *G02B 27/0025* (2013.01); *G03F 7/706* (2013.01); (Continued)

(58) Field of Classification Search
  CPC . G02B 27/0025; G02B 27/005; G03F 7/7015; G03F 7/70191; G03F 7/70241; G03F 7/70308; G03F 7/70591; G03F 7/706
  (Continued)

(56) References Cited

U.S. PATENT DOCUMENTS 5,117,255 A    5/1992    Shiraishi et al.
5,148,314 A    9/1992    Chen
(Continued)

FOREIGN PATENT DOCUMENTS

EP    0 724 199    7/1996
EP    0 833 180    9/1997
(Continued)

OTHER PUBLICATIONS

International Search Report and a Written Opinion from counterpart application No. PCT/EP2005/005930, dated Oct. 4, 2005.
(Continued)

*Primary Examiner* — Colin Kreutzer
(74) *Attorney, Agent, or Firm* — Fish & Richardson P.C.

(57) ABSTRACT

A projection objective of a microlithographic projection exposure apparatus contains a plurality of optical elements arranged in $N>-2$ successive sections $A_1$ to $A_N$ of the projection objective which are separated from one another by pupil planes or intermediate image planes. According to the invention, in order to correct a wavefront deformation, at least two optical elements each have an optically active surface locally reprocessed aspherically. A first optical element is in this case arranged in one section $A_j$, $j=1 \ldots N$ and a second optical element is arranged in another section $A_k$, $k=1 \ldots N$, the magnitude difference $|k-j|$ being an odd number.

11 Claims, 1 Drawing Sheet

Related U.S. Application Data continuation of application No. 13/272,440, filed on Oct. 13, 2011, now Pat. No. 8,902,407, which is a continuation of application No. 11/570,263, filed as application No. PCT/EP2005/005930 on Jun. 2, 2005, now Pat. No. 8,064,041.

(60) Provisional application No. 60/578,522, filed on Jun. 10, 2004.

(51) Int. Cl.
  G03B 27/54    (2006.01)
  G03B 27/68    (2006.01)
  G03F 7/20     (2006.01)
  G02B 27/00    (2006.01)

(52) U.S. Cl.
  CPC ........ *G03F 7/7015* (2013.01); *G03F 7/70191* (2013.01); *G03F 7/70225* (2013.01); *G03F 7/70308* (2013.01); *G03F 7/70591* (2013.01); *G03F 7/70241* (2013.01)

(58) Field of Classification Search
  USPC .............. 250/492.2; 355/52, 53, 55, 67, 77; 359/355, 357, 364
  See application file for complete search history.

(56) References Cited

U.S. PATENT DOCUMENTS

| | | | |
|---|---|---|---|
| 5,392,119 | A | 2/1995 | McArthur et al. |
| 5,682,226 | A | 10/1997 | Anzai et al. |
| 5,757,017 | A | 5/1998 | Braat |
| 6,157,498 | A | 12/2000 | Takahashi |
| 6,262,793 | B1 | 7/2001 | Sasaya et al. |
| 6,266,389 | B1 | 7/2001 | Murayama et al. |
| 6,268,903 | B1 | 7/2001 | Chiba et al. |
| 6,333,776 | B1 | 12/2001 | Taniguchi |
| 6,366,389 | B1 | 4/2002 | Wraback et al. |
| 6,388,823 | B1 | 5/2002 | Gaber et al. |
| 6,522,386 | B1 | 2/2003 | Nishi |
| 6,545,746 | B1 | 4/2003 | Nishi |
| 6,636,350 | B2 | 10/2003 | Shafer et al. |
| 8,064,041 | B2 | 11/2011 | Wabra et al. |
| 2001/0043391 | A1 | 11/2001 | Shafer et al. |
| 2002/0171048 | A1 | 11/2002 | Braat |
| 2002/0171815 | A1 | 11/2002 | Matsuyama et al. |
| 2003/0197922 | A1 | 10/2003 | Hudyma |
| 2004/0169836 | A1 | 9/2004 | Wegmann |
| 2004/0246595 | A1 | 12/2004 | Beach |
| 2007/0019305 | A1 | 1/2007 | Ulrich et al. |

FOREIGN PATENT DOCUMENTS

| | | |
|---|---|---|
| EP | 0 824 721 | 7/2000 |
| EP | 1 024 522 | 8/2000 |
| EP | 1 306 698 | 5/2003 |
| EP | 1 318 425 | 6/2003 |
| EP | 1 336 887 | 8/2003 |
| EP | 1 369 608 | 12/2003 |
| EP | 1 630 585 | 3/2006 |
| JP | 10-154657 | 6/1998 |
| JP | 2002-250865 | 9/2002 |
| JP | 2002-258131 | 9/2002 |
| JP | 2005-064310 | 3/2005 |
| WO | WO 01/55767 | 8/2001 |
| WO | WO 02/44786 | 6/2002 |
| WO | WO 2004/010164 | 1/2004 |
| WO | WO 2004/019128 | 3/2004 |
| WO | WO 2004/107011 | 12/2004 |
| WO | WO 2005/121899 | 12/2005 |

OTHER PUBLICATIONS

Matsuyama et al., "Nikon Projection Lens Update", Optical Microlithography XVII, edited by Bruce W. Smith, Proceedings of SPIE vol. 5377 (SPIE, Bellingham, WA, 2004).

Besenmatter, "Analyse der primaren Wirkung asphärischer Flächen mit Hilfe des Delano-Diagramms," EUMIG, Optik-Entwicklung, A-2351 Wiener Neudorf, Osterreich, (Excerpt), 1978, 7 pages (with English abstract).

Hofmann et al., "Nanometer-Asphären: Wie herstellen und wofür?", 1991, 4 pages (with English abstract).

Hofmann et al., "Technical possibilities to suppress the effects of surface deviations of optical precision components in high performance optics," Yearbook for Optics and Precision Mechanics, Berlin, 1993 (with English translation).

Klaus Merkel et al., "The development of microlithographic high-performance optics", *International Journal of Optoelectronics*, vol. 4, No. 6, pp. 545-562 (1989).

English translation of Japanese Office Action for corresponding JP Appl No. 2007-526253, dated May 16, 2011.

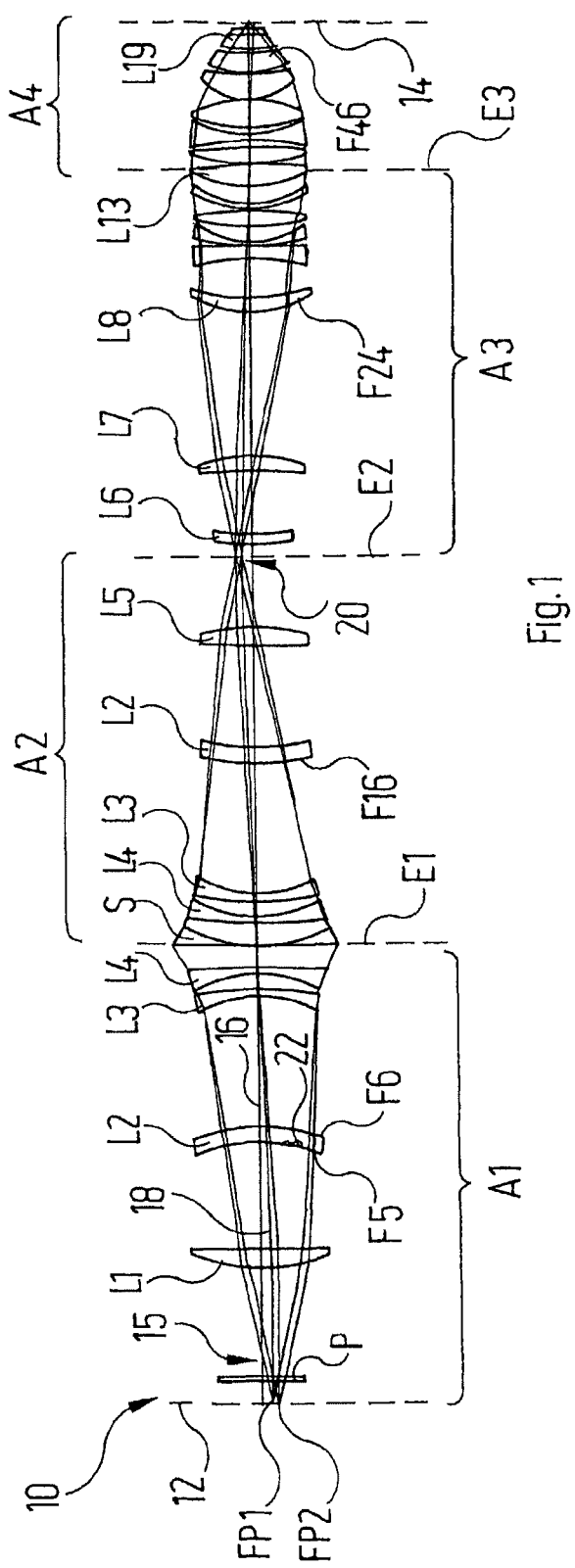
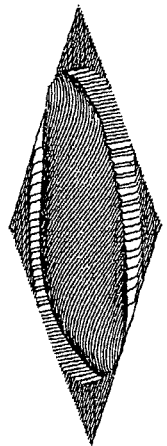
Fig. 4
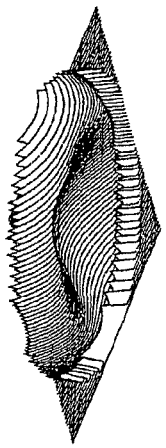
Fig. 3
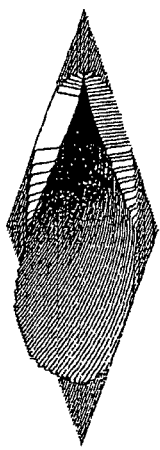
Fig. 2

PROJECTION OBJECTIVE FOR A MICROLITHOGRAPHIC PROJECTION EXPOSURE APPARATUS

CROSS-REFERENCE TO RELATED APPLICATIONS

This application is a continuation of U.S. application Ser. No. 14/506,992, filed on Oct. 6, 2014, which is a continuation of, and claims priority to U.S. application Ser. No. 13/272,440, filed Oct. 13, 2011, now U.S. Pat. No. 8,902,407, which is a continuation of, and claims priority to U.S. application Ser. No. 11/570,263, filed Nov. 13, 2007, now U.S. Pat. No. 8,064,041, which is a National Stage of International Application No. PCT/EP2005/005930, filed Jun. 2, 2005, which claims the benefit of U.S. Provisional Application Ser. No. 60/578,522, filed Jun. 10, 2004. The contents of the prior applications are hereby incorporated by reference in their entirety.

The invention relates to a projection objective for microlithographic projection exposure apparatus, such as those used for the production of microstructured components.

Microlithographic projection exposure apparatus, such as those used for the production of large-scale integrated electrical circuits, have an illumination device which is used to generate a projection light beam. The projection light beam is aimed at a reticle which contains structures to be imaged by the projection exposure system, and which is arranged in an object plane of a projection objective. The projection objective forms a reduced image of the structures of the reticle on a photosensitive surface, which is located an image plane of the projection objective and may for example be applied on a wafer.

Owing to the small size of the structures to be imaged, stringent requirements are placed on the imaging properties of the projection objective. Imaging errors can therefore be tolerated only to a very small extent.

In general, imaging errors which occur are assigned to the following categories. On the one hand, there are imaging errors which result from the design of the projection objective, i.e. in particular the specification of dimensions, materials and distances in the optical elements contained in the projection objective. These design errors will not be considered below.

On the other hand, there are imaging errors which are attributable to production or material errors and which it is generally sensible to correct only once the objective is finished. Examples of production errors include so-called form errors, which are intended to mean deviations from surface accuracy in the case of optical surfaces. Material errors, however, do not generally affect the condition of the optically active surfaces, i.e. ones through which projection light passes, but lead to inhomogeneous refractive index profiles inside the optical element. The possible causes of such imaging errors due to production or material will more generally be referred to below as perturbations, which may be locally very limited but which may even extend over a sizeable region of the optical element in question.

In order to correct the wavefront deformations caused by such perturbations, it is known to apply corrective structures to suitable optical surfaces of the projection objective by means of reprocessing, which generally involves material erosion. The reprocessing gives the surface an aspherical shape that is generally not rotationally symmetric, and which differs from the shape on which the design of the projection objective was based. Such reprocessing methods are described at length in an article by C. Hofmann et al. entitled "Nanometer Asphären: Wie herstellen und wofür?", Feinwerktechnik und Meßtechnik 99 (1991), 10, pp. 437 to 440.

The way in which the corrective structures required for the compensation may be deduced from the wavefront deformations, which can generally be recorded by measuring techniques, is described at length in U.S. Pat. No. 6 268 903 B1. In the method described there, the optical element whose surface is to be locally reprocessed for perturbation compensation is preferably a plane-parallel plate, which is arranged between the reticle and the projection objective of the projection exposure apparatus. The known corrective element may furthermore be arranged inside the objective, before or after a shutter contained therein, in which case a position where the projection light beam has a particularly small cross section is preferred.

However, it has been found that not all optically active surfaces inside the projection objective are equally suitable for correcting a wavefront deformation by local reprocessing. Since projection objectives generally contain a large number of optically active surfaces, it is not in fact readily possible to determine the correction potential computationally for all these surfaces. As a rule, therefore, empirical values or rules of thumb are relied upon when choosing which optically active surfaces should be reprocessed in order to compensate for perturbations. For example, a small diameter of the projection light beam is highlighted as an essential criterion in the method known from the aforementioned U.S. Pat. No. 6,268,903 B1.

It has been found, however, that the imaging properties often cannot be improved sufficiently with the known criteria for the selection of surfaces to be reprocessed.

It is therefore an object of the invention to provide a projection objective in which more effective compensation for wavefront deformations that occur is achieved by reprocessing of optically active surfaces.

This object is achieved by a projection objective of a microlithographic projection exposure apparatus, having a plurality of optical elements arranged in N≥2 successive sections $A_1$ to $A_N$ of the projection objective which are separated from one another by pupil planes or intermediate image planes. In order to correct a wavefront deformation, at least two optical elements respectively have an optically active surface locally reprocessed aspherically, a first optical element being arranged in one section $A_j$, j=1 . . . N and a second optical element being arranged in another section $A_k$, k=1 . . . N, and the magnitude difference |k−j|0 being an odd number.

The invention is based on the discovery that the optically active surfaces have fundamental differences in terms of their suitability for correcting wavefront deformations by appropriate reprocessing. An essential criterion in this regard involves the sections of the projection objective, separated from one another by pupil planes or intermediate image planes, where the surfaces being considered for reprocessing lie. In fact, it has been found that a wavefront deformation which is present in one section, and whose field dependency with respect to the azimuth angle has an odd symmetry, can only be corrected by a reprocessed surface in the same section but not by a reprocessed surface in a neighbouring section. Only with reprocessed surfaces lying in the next but one section, or more generally in the $n+2k^{th}$ section, is it possible to achieve almost complete correction.

The reason for this is that an image curvature occurs in shutter and intermediate image planes, which affects not only the odd components but also the even components of the field dependency of a wavefront deformation caused by the perturbation.

If there was only a single perturbation at a known position in a projection objective, then the wavefront deformation caused by it could be corrected by reprocessing an optically active surface which lies in the same section as the perturbation. In general, however, there are a multiplicity of perturbations at unknown positions distributed over a plurality of sections of the projection objective. Their perturbing effects are superimposed and deform the wavefront together.

For this reason, it is necessary to reprocess surfaces either in at least two immediately adjacent sections, or in sections between which there are an even number of other sections. This means that for each perturbation, a correction is carried out in the same section n, in the next but one section n±2 or more generally in the section n±2k, k=0, 1, 2, . . . only this will ensure that any field-dependent wavefront deformation which is caused by the deformation, and which contains both even and odd symmetry components, can be corrected almost completely.

If, as is generally desirable, it is also necessary to correct a field-independent wavefront error, i.e. one which is common to all the field points, then a third optical element which is arranged in or close to a pupil plane must also have a locally reprocessed optically active surface. With a total of three reprocessed surfaces at positions selected in this way inside the projection objective, it is therefore possible to correct all wavefront deformations sufficiently well.

An exemplary embodiment of the invention will be explained below with reference to the drawing, in which:

FIG. 1 shows a projection objective according to the invention in a sequential representation;

FIG. 2 shows a three-dimensional representation of an even wavefront deformation;

FIG. 3 shows a three-dimensional representation of an even wavefront deformation which is independent of the azimuth angle;

FIG. 4 shows a three-dimensional representation of an odd wavefront deformation.

FIG. 1 shows a meridian section through a projection objective, denoted overall by 10, of a microlithographic projection exposure apparatus in a sequential representation. As will be explained below, the sequential representation is more favourable here; a true representation of this projection objective, which also shows two plane mirrors used for the beam deviation, can be found in the Applicant's WO 2004/010164 A2, the disclosure of which is hereby fully incorporated.

The projection objective 10 is designed to image structures of a reticle (not shown in FIG. 1), which is introduced into an object plane 12 of the projection objective 10 during operation of the projection exposure apparatus, onto a photosensitive surface (also not represented). This surface may be applied on a wafer, for example, and it is arranged in an image plane 14 of the projection objective 10.

The projection objective 10 has a plane-parallel plate P arranged on the entry side and a multiplicity of lenses, of which only a few lenses L1 to L8 and L13 and L19 that are more important for the explanation of the exemplary embodiment are provided with their own references in FIG. 1 for the sake of clarity. The projection objective 10 furthermore contains a spherical imaging mirror, denoted by S, through which light can be seen to pass in the sequential representation of FIG. 1.

The route of the projection light through the projection objective 10 will be described below with reference to ray paths 15, which originate from two field points FP1 and FP2 arranged in the object plane 12. After passing through the plane-parallel plate P, the projection light 15 arrives at a plane deviating mirror (not shown in the sequential representation) and subsequently passes through the lenses L1 to L4. After reflection at the spherical imaging mirror S, which is arranged in a pupil plane E1, the projection light passes back through the lenses L1 to L4 in the reverse order.

Since the illuminated field in the object plane 12 is arranged offset with respect to the optical axis 16 of the projection objective 10, after reflection at the imaging mirror S the light beam travels along a route which leads to a spatial offset with respect to the incident light beam. Behind the lens L1, this offset between the light beam incident on the imaging mirror S and the light beam reflected by it is so great that the reflected light beam does not strike the first deviating mirror but instead, after passing through the lens L6, arrives at a second plane deviating mirror (which also cannot be seen in the sequential representation).

After reflection at the second deviating mirror, the projection light passes through a multiplicity of further lenses L7 to L19 and a plane-parallel closure plate, and finally arrives at the image plane 14 of the projection objective 10.

There is an intermediate image plane E2 between the lenses L5 and L6, and a further pupil plane E3 in the lens L13. The two pupil planes E1 and E3, as well as the intermediate image plane E2, subdivide the overall projection objective 10 into a total of four sections A1, A2, A3 and A4, the lenses L2, L3 and L4 being associated both with the section A1 and with the section A2 depending on the transmission direction of the projection light.

The pupil planes E1 and E3, as well as the intermediate image plane E2, respectively have the property that they turn over the image, i.e. they invert the imaging of the system. This will be explained in relation to the pupil plane E1 with reference to the example of a primary ray 18 originating from the field point FP1. In the section A1, i.e. before reflection at the imaging mirror S, the primary ray 18 passes through the lens L2 below the optical axis 16, whereas after reflection at the imaging mirror S, it passes through the same lens L2 above the optical axis 16, i.e. point-reflected relative to the first case.

The inversion of the imaging through the pupil plane E1 can also be seen at the position of the intermediate image 20 produced in the intermediate image plane E2, which is turned over relative to the object (field points FP1 and FP2) in the object plane 12.

Similar considerations apply to the other pupil plane E3 and the intermediate image plane E2.

It will now be assumed that on its surface F5—these are numbered sequentially through the projection objective 10—the lens L2 has a perturbation indicated by 22 which, as explained, does not need to be rotationally symmetric with respect to the optical axis 16. The cause of this perturbation may, for example, be a form error or a refractive index inhomogeneity of the lens material.

The effect of the perturbation 22 is that all light waves which pass through the perturbation 22 are deformed in an undesirable way. In this context, it should borne in mind that light waves originate from all field points in the object plane 12. Whether the wavefront of one of these light waves will be deformed, and the way in which it is deformed, generally depends on the field point from which the relevant light wave originates. As a rule, specifically with perturbations outside a pupil plane, there are even field points whose light waves are not affected at all by the perturbation since they do not pass through the perturbation.

It is simplest to describe wavefront deformations in an exit pupil, since the ideal wavefront there is a spherical wave. The so-called Zernike polynomials $Z_r$ are often employed to describe wavefront deformations, these being a function system usually represented in polar coordinates, which are orthogonal in the unit circle. A wavefront deformation can then be described as a vector in an infinite-dimensional vector space, the basis of which is spanned by the Zernike polynomials. In this context, the wavefront deformation is also referred to as being expanded in the Zernike polynomials $Z_r$. The coefficients of this expansion are the components of the aforementioned vector.

If the position of the perturbation 22 is known, as will initially be assumed here, then it is possible to determine for the light waves originating from each individual field point whether, and if so how, the wavefront of the respective light wave is deformed by the perturbation 22. For example, the Zernike polynomials $Z_r$ may be employed to describe the wavefront deformation associated with a field point. Conversely, it is possible to determine therefrom how a particular wavefront deformation, defined by a single Zernike polynomial $Z_r$, is distributed over the individual field points. A tilt of the wavefront, as described for instance by the Zernike polynomial $Z_2$, may for example be commensurately stronger the further the field points are away from the optical axis.

The field dependency of the wavefront deformation caused by the perturbation may likewise be described by Zernike polynomials $Z_r$. For this reason, the wavefront deformation is also referred to as being expanded in the field coordinates.

FIGS. 2 to 4 show a three-dimensional representation of the Zernike polynomials $Z_5$, $Z_9$ and $Z_8$, respectively, which are given by $$Z_5(r,\theta) = \sqrt{6} r^2 \cdot \cos(2\theta),$$

$$Z_9(r,\theta) = \sqrt{5}(6r^4 - 6r^2 + 1) \text{ and}$$

$$Z_8(r,\theta) = \sqrt{8} \cdot (3r^2 - 2) \cdot r \cdot \sin(\theta).$$

The radial coordinate r in this case denotes the radial coordinate, i.e. the distance from the optical axis, and $\theta$ denotes the azimuth angle.

The Zernike polynomial $Z_5(r,\theta)$ represented in FIG. 2 is an even function with respect to point reflections on the optical axis. For such a point reflection, which is described by the coordinate transformation $$\theta \rightarrow \theta + 180° \text{ and}$$

$$r \rightarrow r$$

the following applies $$Z_r(r,\theta) = Z_r(r,\theta + 180°).$$

Since it is independent of the azimuth angle $\theta$, the Zernike polynomial $Z_9(r,\theta)$ represented in FIG. 3 is likewise an even function with respect to point reflections.

The Zernike polynomial $Z_8(r,\theta)$ represented in FIG. 4, however, is an odd function with respect to such point reflections, since $$Z_8(r,\theta) = -Z_8(r,\theta 180°).$$

If it is assumed here for the sake of simplicity that the field dependency of a wavefront deformation can be described just by the Zernike polynomial $Z_5$, which is even with respect to point reflections, then it can be seen that such a field dependency is unchanged by an image inversion associated with passing through a pupil plane or intermediate image plane E1, E3, or E2. Similar considerations apply to the rotationally symmetric wavefront deformation represented in FIG. 3, since this is described by the Zernike polynomial $Z_9$ which is also even.

The situation, however, is different for a wavefront deformation whose field dependency can be described just by an odd Zernike polynomial, for example the Zernike polynomial $Z_8$ represented in FIG. 4. In this case, the effect of the image inversion at a pupil plane or intermediate image plane E1, E3, or E2 is that the field dependencies are no longer the same before and after such a plane.

If the perturbation 22 on the lens L2 is now to be compen-sated for by reprocessing an optically active surface on one of the other optical elements, then the aforementioned different symmetry properties of the field dependencies when the light waves pass through pupil planes or intermediate image planes E1, E2, E3 have wide-ranging consequences. This is because since the field dependencies of the wavefront deformations can generally be described only by a combination of even and odd Zernike polynomials, the field-dependency components assigned to these polynomials are transformed in different ways when passing through pupil planes or intermediate image planes E1, E2, E3.

This means that in the section A2 next to the section A1 containing the perturbation 22, it is generally not possible to find an optically active surface on optical elements contained therein with which the odd components of the field dependencies can be eliminated by suitable reprocessing. Perturbation compensation on a single optically active surface in this section A2 is successful only for the even components of the field dependency.

In the subsequent section A3, however, it is again possible to compensate substantially for the perturbation 22 in the section A1 by reprocessing a single optically active surface, since the image inversions caused by the pupil plane E1 and the intermediate image plane E2 balance each other out.

The different corrective potentials of optically active surfaces, according to which of the sections A1 to A4 contains the corresponding surface, has been demonstrated with the aid of simulations. Table 1 gives the residual error remaining as an RMS (root mean square value) and the corrective potential, indicated as a percentage, for suitably reprocessed surfaces $F_i$ in different sections A1 to A4. The simulation is in this case based on the assumption that the perturbation 22 on the lens L2 can be described by the Zernike polynomial $Z_{13}$.

It can be seen clearly from the table that only the surfaces F6 and F24, respectively lying in the same section A1 and in the next but one section A3, can substantially reduce the imaging errors due to the perturbation 22 by suitable reprocessing, and therefore have a large corrective potential. The surfaces F16 and F46 which lie in the sections A2 and A4, respectively, and which would likewise be considered for conventional corrective surface configuration, have only a very small corrective potential compared with these.

TABLE 1

Corrective potential of different correction surfaces

| REPROCESSED SURFACE | SECTION | ERROR (RMS) | CORRECTIVE POTENTIAL |
|---|---|---|---|
| no reprocessing | — | 1.6 | 0% |
| F6 | A1 | 0.1 | 95.7% |

TABLE 1-continued

Corrective potential of different correction surfaces

| REPROCESSED SURFACE | SECTION | ERROR (RMS) | CORRECTIVE POTENTIAL |
|---|---|---|---|
| F16 | A2 | 1.3 | 15.8% |
| F24 | A3 | 0.2 | 86.1% |
| F46 | A4 | 1.3 | 21.7% |

In the preceding discussion, it was assumed that there is only one perturbation 22 whose position is known. However, a wavefront deformation is contributed to in general by a plurality of perturbations, which furthermore cannot be located, or at least not with tolerable outlay. This means that it is not generally possible correct a wavefront deformation by a single reprocessed surface. If one surface in the section A1 and another surface in the section A3 were reprocessed, for example, then generally no contributions to the wavefront deformation which are attributable to perturbations in the section A2 lying in between could therefore be corrected.

It follows from this argument that an effective correction of unknown perturbations can generally be carried out only by reprocessing surfaces in at least two sections which are consecutive, or between which there are an even number of other sections. In the present exemplary embodiment, these could be the section combinations A1 and A2, A2 and A3, A3 and A4, A1 and A4.

With the measures described above, it is only possible to correct components of a wavefront deformation which vary from field point to field point. A field-independent component (offset) of a wavefront deformation, i.e. one which is common to all the field points, cannot be corrected by local reprocessing of surfaces in the sections A1 to A4, but only by reprocessing of surfaces which lie in or close to one of the pupil planes E1, E3. Since wavefront deformations often have such an offset component as well, not just two but three surfaces will have to be reprocessed in order to be able to at least approximately correct wavefront deformations of the most general type.

The invention claimed is:

1. A process for producing a projection objective for microlithography, comprising:
    assembling a plurality of optical elements to form the projection objective in an initial arrangement for directing light from a first field plane to a second field plane to form an image at the second field plane of an object at the first field plane, there being at least one intermediate image at a corresponding field plane and at least two pupil planes in a path of the light between the first field plane and the second field plane, the plurality of optical elements comprising a first lens and a second lens;
    removing the first lens from the assembled projection objective and forming a first corrective structure on a curved surface of the first lens;
    removing the second lens from the assembled projection objective and forming a second corrective structure on a curved surface of the second lens; and
    arranging the first and second lenses in the projection objective after forming the corrective structures, wherein:
    the first lens is positioned in the projection objective in the path downstream from an adjacent one of the field planes and upstream from an adjacent one of the pupil planes and the second lens is positioned in the path upstream from an adjacent one of the field planes and downstream from an adjacent one of the pupil planes, and
    arranging the first and second lenses in the projection objective comprises positioning the first and second corrective structures relative to each other so that their combined effect is to reduce an imaging error of the projection objective at the second field plane relative to the initial arrangement of the projection objective.

2. The process of claim 1, wherein the first and second corrective structures are formed by erosion of a lens material.

3. The process of claim 2, wherein a depth by which the lens material is eroded is less than 500 nm.

4. The process of claim 1, wherein the imaging error is caused by a form error in one of the optical elements or a refractive index inhomogeneity of a lens material.

5. The process of claim 1 wherein the projection objective comprises an additional optical element arranged in or close to one of the pupil planes, the additional optical element comprising a surface in the path of the light that is not rotationally symmetric with respect to the optical axis of the projection objective due to a corrective structure at the surface of the additional optical element.

6. The process of claim 5, wherein the corrective structure at the surface of the additional optical element corrects a field-independent wavefront error during operation of the projection objective.

7. The process of claim 1, wherein the projection objective is a catadioptric projection objective.

8. The process of claim 7, wherein the catadioptric projection objective comprises a concave mirror.

9. The process of claim 8, wherein the mirror is positioned in a vicinity of one of the pupil planes.

10. The process of claim 8, wherein one of the intermediate images is downstream from the concave mirror in the light path.

11. The process of claim 8, wherein the catadioptric projection objective comprises a pair of fold mirrors.

* * * * *

UNITED STATES PATENT AND TRADEMARK OFFICE
CERTIFICATE OF CORRECTION

PATENT NO. : 9,588,445 B2
APPLICATION NO. : 15/008519
DATED : March 7, 2017
INVENTOR(S) : Norbert Wabra and Robert Eder It is certified that error appears in the above-identified patent and that said Letters Patent is hereby corrected as shown below:

In the Specification

Column 2
Line 49, delete "$|k-j|0$" and insert -- $|k-j|$ --
Line 64, delete "$n + 2\kappa^{th}$" and insert -- $n \pm 2\kappa^{th}$ --

Column 4
Lines 12-13, delete "pro jection" and insert -- projection --

Column 5
Line 63 (Approx.), delete "$-Z_8(r,\theta 180°)$." and insert -- $-Z_8(r,\theta +180°)$. --

Column 6
Line 15 (Approx.), delete "compen-sated" and insert -- compensated --

In the Claims

Column 8
Line 31, in Claim 5, delete "claim 1" and insert -- claim 1, --

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*